(12) United States Patent
Virtala

(10) Patent No.: US 10,809,287 B2
(45) Date of Patent: Oct. 20, 2020

(54) METHOD AND SYSTEM AND COMPUTER PROGRAM FOR MEASURING ALTERNATING-CURRENT SYSTEM QUANTITIES

(71) Applicant: ARCTEQ RELAYS OY, Vaasa (FI)

(72) Inventor: Tero Virtala, Vaasa (FI)

(73) Assignee: Arcteq Relays Oy, Vaasa (FI)

( * ) Notice: Subject to any disclaimer, the term of this patent is extended or adjusted under 35 U.S.C. 154(b) by 0 days.

(21) Appl. No.: 16/295,246

(22) Filed: Mar. 7, 2019

(65) Prior Publication Data
US 2019/0204370 A1  Jul. 4, 2019

Related U.S. Application Data

(63) Continuation-in-part of application No. 14/912,111, filed as application No. PCT/FI2014/050628 on Aug. 15, 2014, now abandoned.

(30) Foreign Application Priority Data

Aug. 16, 2013  (FI) .................................... 20135835

(51) Int. Cl.
*G01R 19/25* (2006.01)
*G01R 23/02* (2006.01)
(Continued)

(52) U.S. Cl.
CPC ......... *G01R 23/02* (2013.01); *G01R 19/0007* (2013.01); *G01R 19/2506* (2013.01);
(Continued)

(58) Field of Classification Search
CPC ........................... G01R 19/25; G01R 19/0007
(Continued)

(56) References Cited

U.S. PATENT DOCUMENTS

| 5,014,229 A | 5/1991 | McEachern |
| 5,151,866 A | 9/1992 | Glaser et al. |

(Continued)

FOREIGN PATENT DOCUMENTS

| CN | 103063913 | 4/2013 |
| EP | 1936391 | 6/2008 |
| EP | 2306208 | 4/2011 |

OTHER PUBLICATIONS

International Search Report, International Application No. PCT/FI2014/050628, dated Dec. 11, 2014.
(Continued)

*Primary Examiner* — Muna A Techane
(74) *Attorney, Agent, or Firm* — Fildes & Outland, P.C.

(57) ABSTRACT

A method and system for measuring alternating-current system quantities through measurement connections producing frequency-dependent errors, in which method the analog signal of at least one measurement channel is sampled at a selected an approximately measured frequency $f_m$ at a multiple frequency $f_s$, creating a base series depicting a period on each measurement channel, from each base series the fundamental frequency and the magnitude or phase-angle values or both of at least one harmonic frequency component are calculated with the aid of Fourier analysis or similar, each of which is corrected with the aid of a calibrated frequency-dependent function k(f), when the selected quantities are calculated from the calibrated values.

16 Claims, 13 Drawing Sheets

(51) Int. Cl.
  *G01R 19/00* (2006.01)
  *G01R 35/00* (2006.01)
  *G01R 23/16* (2006.01)
(52) U.S. Cl.
  CPC .......... *G01R 19/2513* (2013.01); *G01R 23/16* (2013.01); *G01R 35/005* (2013.01)
(58) Field of Classification Search
  USPC ........................................................ 702/64
  See application file for complete search history.

(56) References Cited

U.S. PATENT DOCUMENTS

| | | | |
|---|---|---|---|
| 5,406,495 A | | 4/1995 | Hill |
| 5,832,414 A | * | 11/1998 | Hart .................. G01R 19/2513 |
| | | | 702/77 |
| 6,636,816 B1 | * | 10/2003 | Dvorak .................. G01R 27/28 |
| | | | 324/76.41 |
| 7,444,248 B2 | | 10/2008 | Premerlani et al. |
| 7,486,067 B2 | * | 2/2009 | Bossche ................. G01R 27/28 |
| | | | 324/76.22 |
| 8,108,165 B2 | | 1/2012 | Benmouyal |
| 10,320,499 B2 | * | 6/2019 | Lomnitz .............. H04B 17/309 |
| 2004/0022444 A1 | | 2/2004 | Rhoads |
| 2004/0186669 A1 | | 9/2004 | Benmouyal |
| 2010/0161263 A1 | * | 6/2010 | Benmouyal ........ G01R 19/2513 |
| | | | 702/72 |
| 2010/0286838 A1 | | 11/2010 | Guzman-Casillas et al. |
| 2011/0074392 A1 | | 3/2011 | Bartlett et al. |
| 2012/0310569 A1 | | 12/2012 | Fan et al. |

OTHER PUBLICATIONS

English language summary of CN 103063913.
Supplementary European Search Report, EP Application No. EP 14 83 6412, dated Mar. 1, 2017.

* cited by examiner

METHOD AND SYSTEM AND COMPUTER PROGRAM FOR MEASURING ALTERNATING-CURRENT SYSTEM QUANTITIES

CROSS REFERENCE TO RELATED APPLICATIONS

This application is a continuation-in-part of U.S. application Ser. No. 14/912,111 filed Feb. 15, 2016, which is a national stage application of PCT/FI2014/050628 filed Aug. 15, 2014, which claims priority from Finland Patent Application No. 20135835 filed Aug. 16, 2013, all of which are incorporated by reference in their entirety.

FIELD OF THE INVENTION

The present invention relates to a method for measuring alternating-current system quantities through measurement channels producing frequency-dependent errors, in which method
 a) an analog signal is produced through each channel formed by a measurement channel, depicting the selected current/voltage quantity, and
 b) at least one analog signal is sampled at a selected approximately measured frequency $f_i$, creating a base series depicting a period, from which the selected quantities are defined.

The invention also relates to a corresponding system and computer program for implementing the method.

Though the invention generally concerns 3-phase systems, it can also be applied in single-phase electrical systems. There exists also 6-12-phase systems.

BACKGROUND OF THE INVENTION

The measurement of electric-power network quantities is an important part of the protection monitoring and control of an electric-power network. Many different protections and control automation are fundamentally based on the use of frequency measurement. On the basis of frequency measurement various electric-power network components can be protected from faults overloading and detrimental frequencies. In addition, frequency measurement can be used as a basis for controlling generators. Measurement is also used for power and energy calculation, on which the selling and buying of electricity are based.

Various meters are known from the prior art, which convert the current and voltage signals of an electric-power network into phase angle and magnitude, using so-called Fourier transformation, particularly FFT (Fast Fourier Transform) calculation. Wavelet analysis can also be used. Stated generally, periodic signals are examined using the chosen frequency analysis. The analog signal is sampled at a specific constant frequency through the measurement range. The problem with such a technique is that it does not take into account the measurement error created by frequency differences. If the sampling frequency is, for example, a fixed 50 Hz, and the measured voltage of the electric-power network is 60 Hz, the magnitude of the measurement error will be already about 5% in the different phases of the current.

U.S. Pat. No. 8,108,165 B2 is known from the prior art and discloses one frequency meter, which uses frequency-dependent sampling of analog signals. Frequency-dependent sampling is used over the entire measurement range of 6-75 Hz (more generally 5-100 Hz). If the measured frequency is outside the measurement range, the lowest or highest sampling frequency and a correction factor, which seeks to compensate for the error, are used in the measurement. Despite the frequency-dependent sampling, considerable measurement errors appear in frequency measurement of this kind, as the measurement does not take into account the error caused by the components of the measurement card.

SUMMARY OF THE INVENTION

The invention is intended to create a method that is more accurate and reliable than methods of the prior art for measuring frequency in an electric-power network. As, according to the invention, the non-linearity of the analog component of each measurement channel is calibrated at different frequencies and a frequency-dependent correction function is created, the method according to the invention gives an extremely accurate result over a wide frequency range. The frequency-dependent correction is preferably made to the magnitude and phase-angle values of several frequency components. The correction function is preferably a matrix, in which the elements correspond to a specific input and are the correction values for discrete frequencies. These can be used in a stepped manner, but it is preferable to interpolate the intermediate values. Extreme values can be used outside the nominal frequency range.

Each measurement channel has its own A/D converter and processes an analog signal depicting a selected current or voltage quantity and finally produces a digital signal using the A/D converter. An A/D-converter is often the significant source of non-linearity.

In one exemplary embodiment for measuring 3-phase alternating-current system quantities through measurement channels producing frequency-dependent errors of analog components using a system having CPU and software, each said measurement channel including an A/D converter and processing an analog signal depicting a selected current or voltage quantity and producing a digital output using the A/D converter, which method may be conducted according to the following exemplary steps:
 a) providing a frequency-dependent correction function called a calibrated function k(f) depicting non-linearity of each measurement channel at different frequencies,
 b) producing an analog signal through each channel, depicting said selected current or voltage quantity,
 c) measuring frequency $f_m$ of the analog signal approximately in a chosen channel,
 d) producing momentary frequency-dependent correction values using said calibrated function k(f) at the approximately measured frequency and storing them in a registry,
 e) sampling at least one analog signal at a frequency $f_s$ being a multiple of the approximately measured frequency $f_m$ at a multiple frequency $f_s$, creating a base series depicting a period on the corresponding measurement channel,
 f) from each base series obtained, calculating a base frequency and at least one of magnitude and phase-angle values of at least one harmonic frequency component with the aid of a selected frequency analysis,
 g) correcting each calculated magnitude or phase-angle value or both using the momentary frequency-dependent correction values in the registry in order to eliminate error of each measurement channel, and
 h) calculating selected quantities from calibrated magnitude or phase-angle values or both, i) wherein the momentary frequency-dependent correction values in the registry are recalculated using the calibrated function k(f) when the measured frequency $f_m$ changes more than a selected criterion.

The magnitude and/or phase-angle values are preferably calculated for 7-64, preferably 15-31, harmonic frequency components.

In one embodiment, the device is calibrated magnitude-dependently and a similar correction table is created. The actual correction calculation is entirely the same as that described in connection with the frequency-dependent correction table.

BRIEF DESCRIPTION OF THE DRAWINGS

In the following, the invention is described in detail with reference to the accompanying drawings depicting some embodiments of the invention, in which.

DETAILED DESCRIPTION OF THE INVENTION

Figure 1:
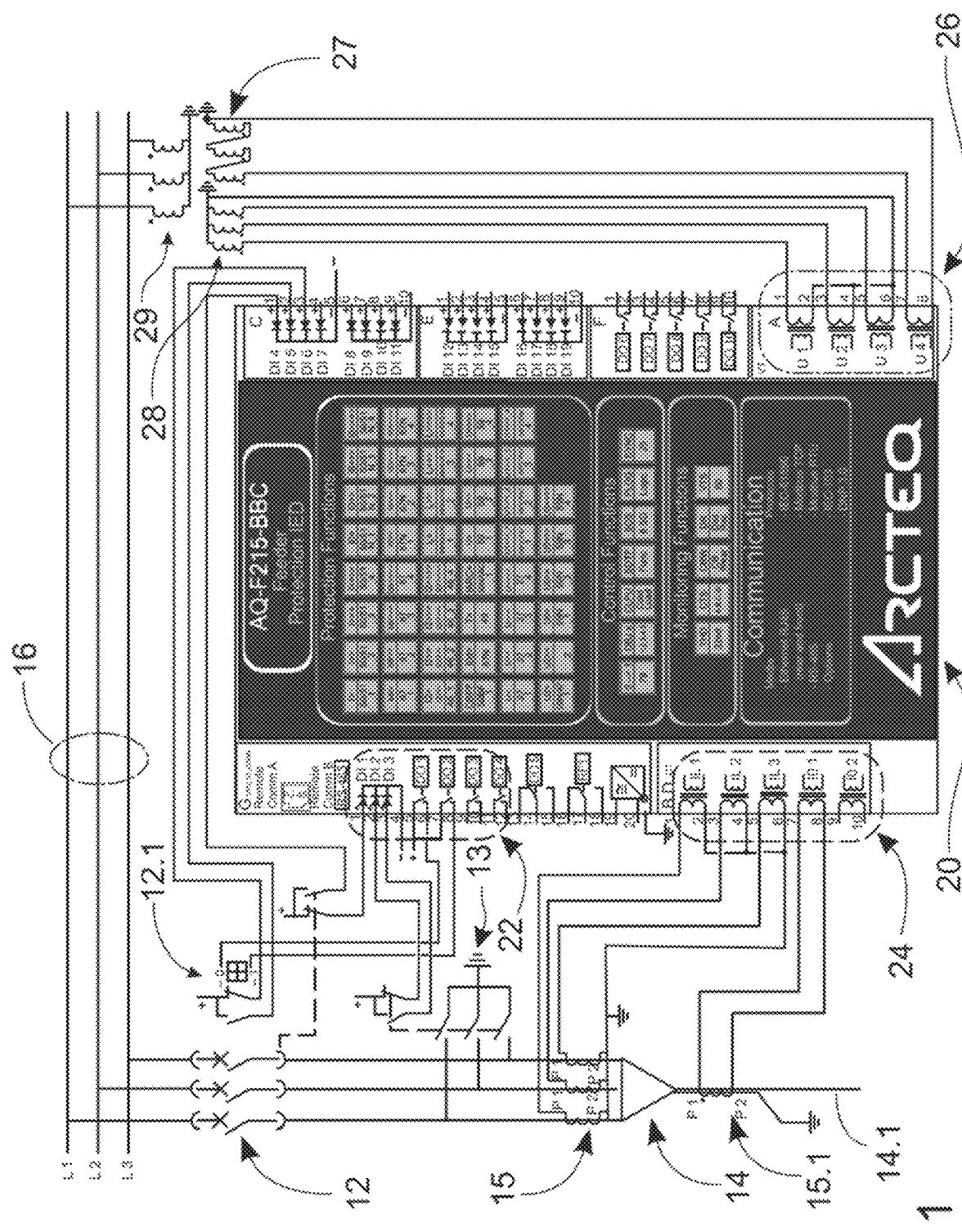
FIG. 1 shows the wiring of the protection device in monitoring a 3-phase feeder line.

The protection device 20 of FIG. 1 monitors a branch line, which is connected to a cable terminal 14, connected to the main line 16. Feed to the branch line, which is depicted by the cable terminal 14, is taken from the phases L1, L2, L3 of the main line 16. The branch line is protected by a 3-phase circuit breaker 12 and an earthing switch 13. The circuit breaker 12 is controlled by a smart protecting device 20. This can measure the voltage inputs U1-U4, and current inputs IL1-IL3, I01 and I02. The operating device of the 3-phase circuit breaker 12, and the state detector of the earthing switch 13 are connected to the outputs D01-D04 of the I/O component 22. The earthing switch 13 is manually operated, but state data are taken from it through the I/O component 22 to the protection device 20, which prevents the circuit breaker 12 from closing, if the earthing is switched on.

Voltage detection uses a common star-connected primary-coil series 29. The voltage inputs U1-U3 (phase voltages) use a star-connected secondary-coil series 28 and the zero voltage to the voltage input U4 is formed by the open-delta connection 27 of the voltage converters. The voltages are taken to the voltage-checking converters 26 of the protection device.

The current detection IL1, IL2, IL3 of the phases of the feed line uses inductively connected coils 15 in each phase conductor. In addition, the current I01 of the earth conductor of the cable terminal is detected by means of a coil 15.1. In this case, the current input I02 is not in use. The current measurements are taken to the current-measurement transformer 24.

A precondition of first-class operation is the precise measurement of the phase quantities, which, when the frequency varies, is challenging, because conventional measurement electronics only operate well at the nominal frequency, for example, 50 Hz.

The input of the current and voltage measurements consists of analog components, which may have a considerable divergence in electrical properties, particularly farther from the nominal frequency.

Figure 2:
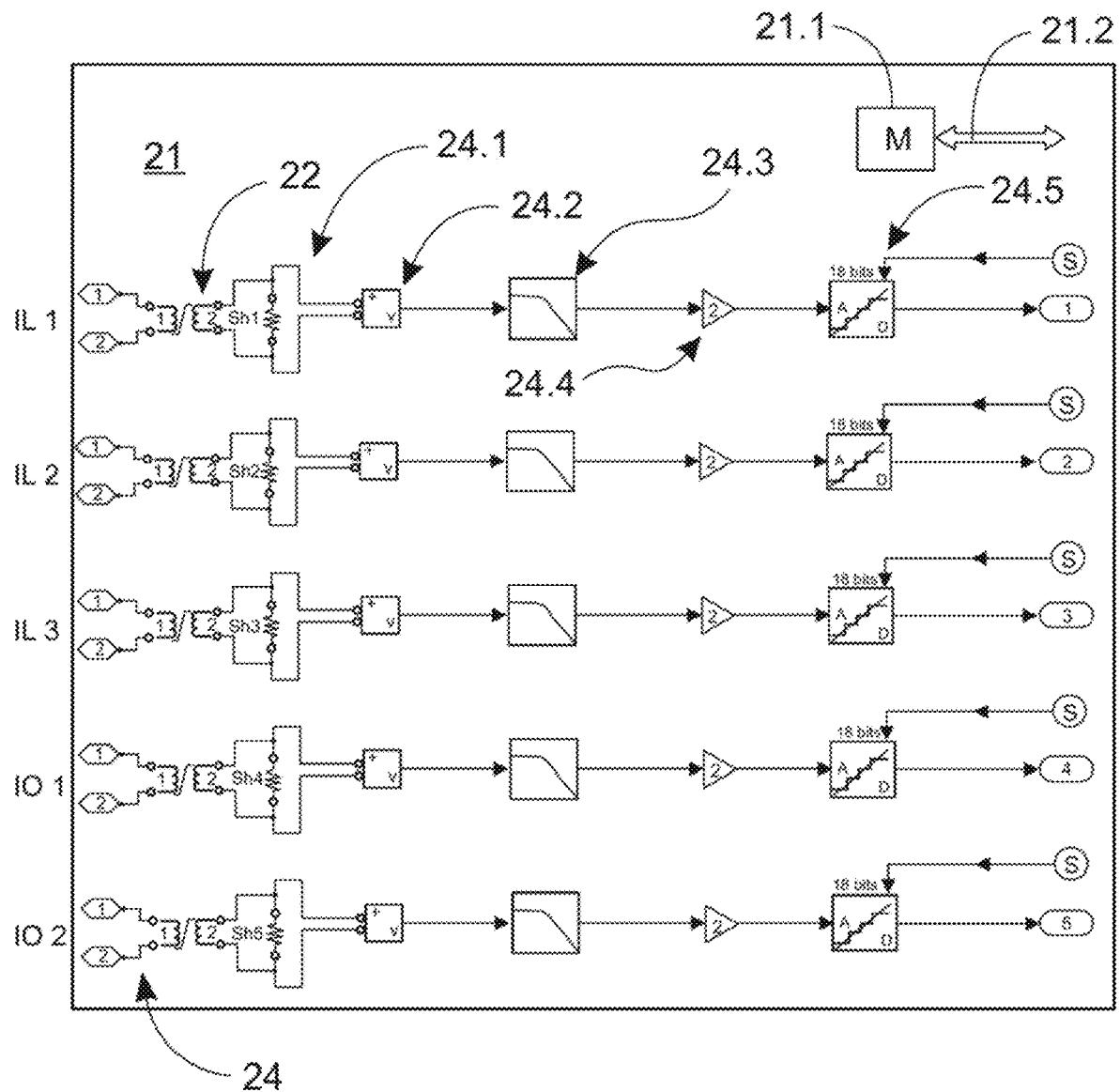
FIG. 2 shows the analog measurement channels of five current-measurement channels on a special analog card.

FIG. 2 shows the configuration of the current-measurements' inputs as far as the A/D converter. The four voltage-measurement chains are in a corresponding manner on a different card (not shown). All the analog components are installed on a special replaceable circuit card 21, in which there is also a non-volatile memory 21.1 and its connection means 21.2. The significance of this memory will become apparent later. The analog components, including the A/D converter, in each measurement circuit form a main non-linearity. In the chain from left to right are: a current transformer 22, a shunt resistance 'Sh$_x$' 24.1, voltage divider resistances 24.2, an analog filter 24.3, an amplifier 24.4, and finally the A/D converter 24.5 itself. The same is also true of the voltage-measurement circuits (not shown).

Each analog signal is sampled at the A/D converter at a multiple of the approximately measured frequency $f_m$ (6-75 Hz, tolerance about 100 mHz) creating a base series depicting the period in such a way that the samples of the period form a fundamental-wave length FFT buffer for each measurement channel of essentially one entire electrical period (e.g, the fundamental wave of a 50-Hz electrical period is 20 ms). The A/D converter is controlled by a sampling signal S brought from the host processor, the frequency of which $f_s$ is adjusted according to the approximately measured base frequency $f_m$, preferably using the equation:

$f_s = f_m \times$ number of samples of the FFT buffer.

FIGS. 3-8 show schematically software implementations of the calculation.

Figure 3:
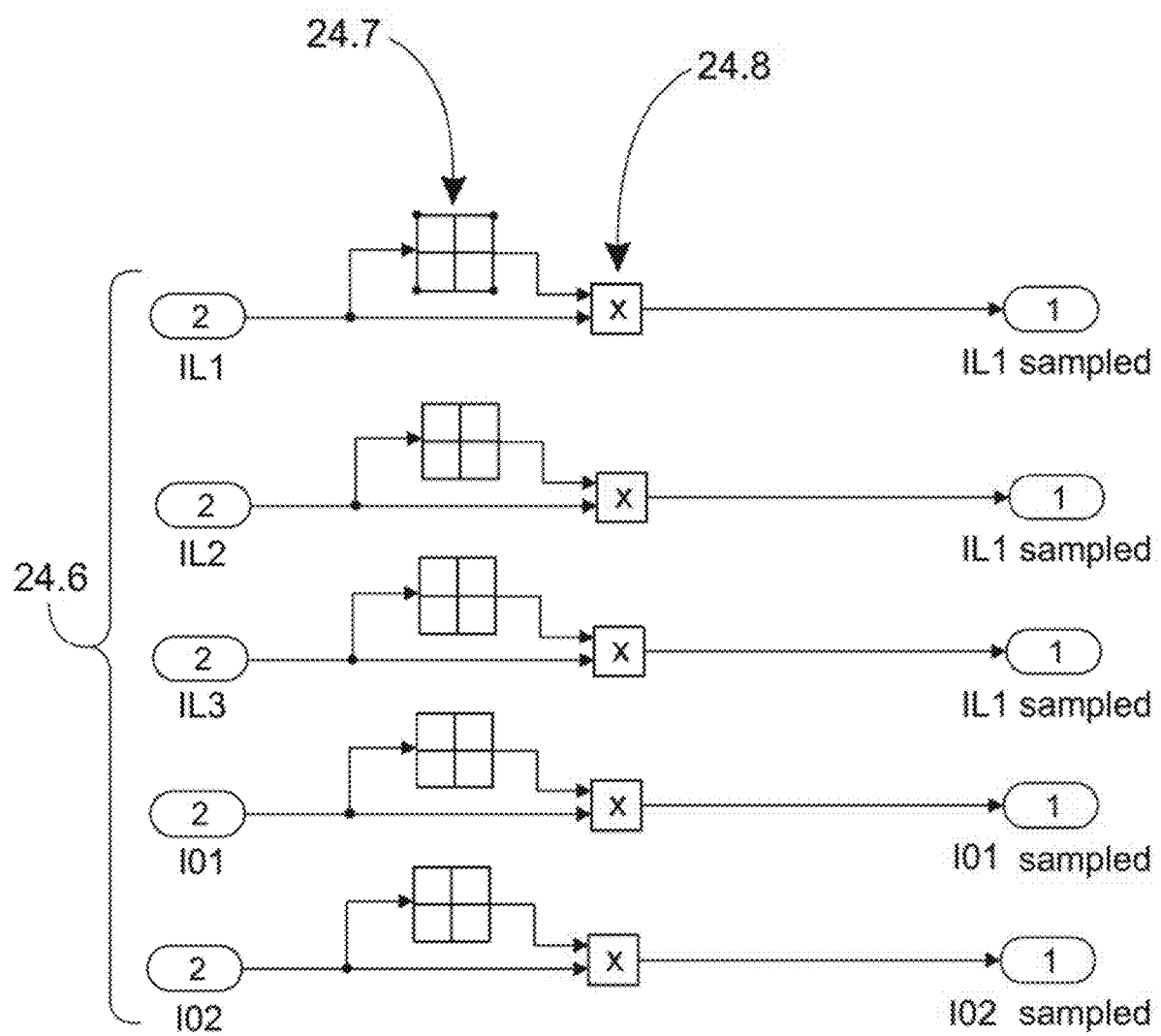
FIG. 3 shows the conversion of values obtained from an A/D converter into current values.

FIG. 3 shows the conversion of raw values 24.6 obtained from the A/D converter into current values. The A/D converter's reading range −132000 . . . +132000 corresponds, for example, to a current range of 0 . . . 100 A. The conversion takes place by fetching from a lookup table 24.7 a channel-specific scaling factor, which is taken together with the value to a multiplier 24.8. This is not important in terms of the invention.

Figure 4:
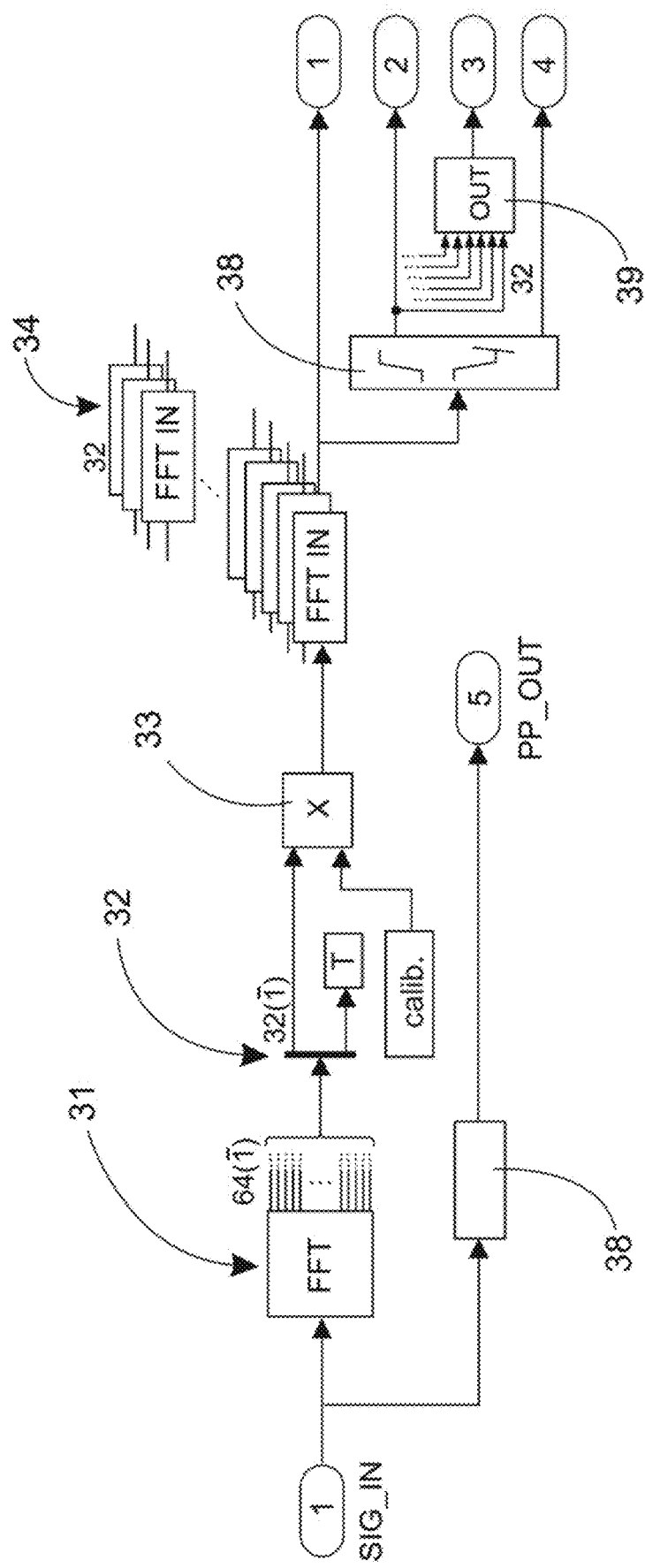
FIG. 4 shows a general view of the processing of each sequence.

In FIG. 4, each channels' base series, i.e. the FFT buffer, is taken to FFT transformation 31, which calculates, in addition to the base frequency 31, the root-mean-square RMS of the magnitude and the phase angle of the harmonic frequency component. From the FFT calculation 31 are obtained 64 vectors, 32 of which are mirror images, which are terminated at the selector 32. FIG. 4 mainly follows the processing of a single frequency component. Here, FFT computation is an effective numerical form of calculation for performing Fourier analysis. The Wavelet technique would provide advantages in the calculation of offset currents and impedance protectors. The necessary frequency analysis can also be made using some other method.

The 32 vectors selected for further processing are scaled to form root-mean-square values in the multiplier 33 (complex vector×(sqrt(2)/number of samples)). After this, the vector of each frequency component (in this case current) is taken to the calibration correction module 34, which is shown in greater detail in FIG. 5. As result, the calibrated vector (output 1) of each frequency component is obtained. From this, a separate magnitude value (output 2) and phase angle (output 4) is formed by a cartesian converter 38. A precise true-root-mean-square value TRMS (output 3) is formed in the calculator 39 from the magnitude values of all the frequency components. It is obtained by taking the square root of the sum of the squares of the magnitude values (32 items).

An approximate maximum value (output 5), which can be used for the approximate adjustment of later stages, for example, is formed from the uncalibrated input signal by the calculator 38.

Figure 5:
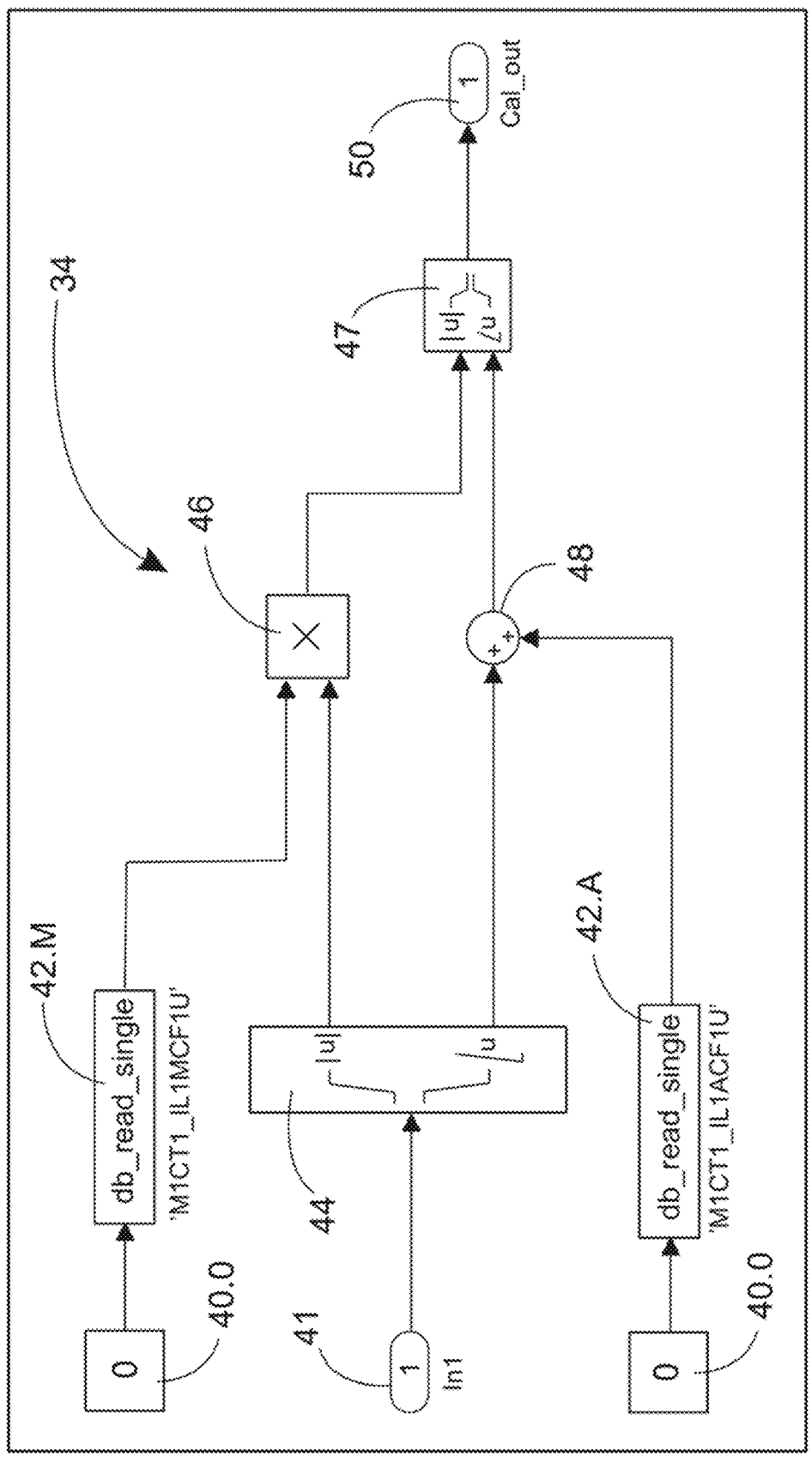
FIG. 5 shows the correction to be made for each frequency component.

FIG. 5 shows the operation of the said calibration-correction module 34, which is essential to the present invention. The vector (e.g., 100 V, j100 V) obtained from the input 41 is divided by the cartesian converter 44 into separate magnitude and phase-angle values (|142 V|, ∠45°), for which a separate calibration correction is made with the aid of pre-calculated frequency-dependent correction factors. In the case of FIG. 5, the processing is base-frequency correction, because the correction factor is read at the clock pulse 0. The vector's first correction factor is 40.0. The channel-specific magnitude correction factor is read from the registry 42.M 'M1CT1_IL1MCF1U' (channel IL1) and is taken to the multiplier 46, in which it is multiplied by the measured value. Correspondingly, the channel-specific phase-angle correction factor is read from the registry 42.A 'M1CT1_IL1ACF1U' (channel IL1) and taken to the summer 48, where it is summed with the retrieved phase angle. Finally, the calibrated values obtained are converted back to vector values by polar conversion and sent to the output 50 'Cal_out'.

Calibration corrections according to FIG. 5 are made on each channel (5 current and 4 voltage-measurement channels) and in each of these for each frequency component (32 items). Calibration coefficients, which are applied to discrete frequencies, and which are obtained in special calibration calculation, are stored in the memory 21.1 (FIG. 2) of the circuit card 21. From there, they are retrieved for use by the host processor, which calculates momentary values corresponding to the frequency in the said registries 42.M and 42.A (in this case M1CT1_IL1MCF1U and M1CT1_IL1ACF1U). As the calibrated correction factors are stored in the circuit card's memory 21.1, it can be changed rapidly and the new circuit card together with the stored correction matrices will provide accurate results immediately.

By calibrating the magnitude and phase angle of the harmonic frequency components, TRMS (True Root Mean Square), the measurements using the different harmonic components and depending on multiple frequencies become accurate, which would otherwise depend entirely on the properties of the available measurement techniques, especially at higher harmonic frequencies. The measurement technique typically measures accurately only at the fixed frequency of the fundamental wave.

Figure 6:
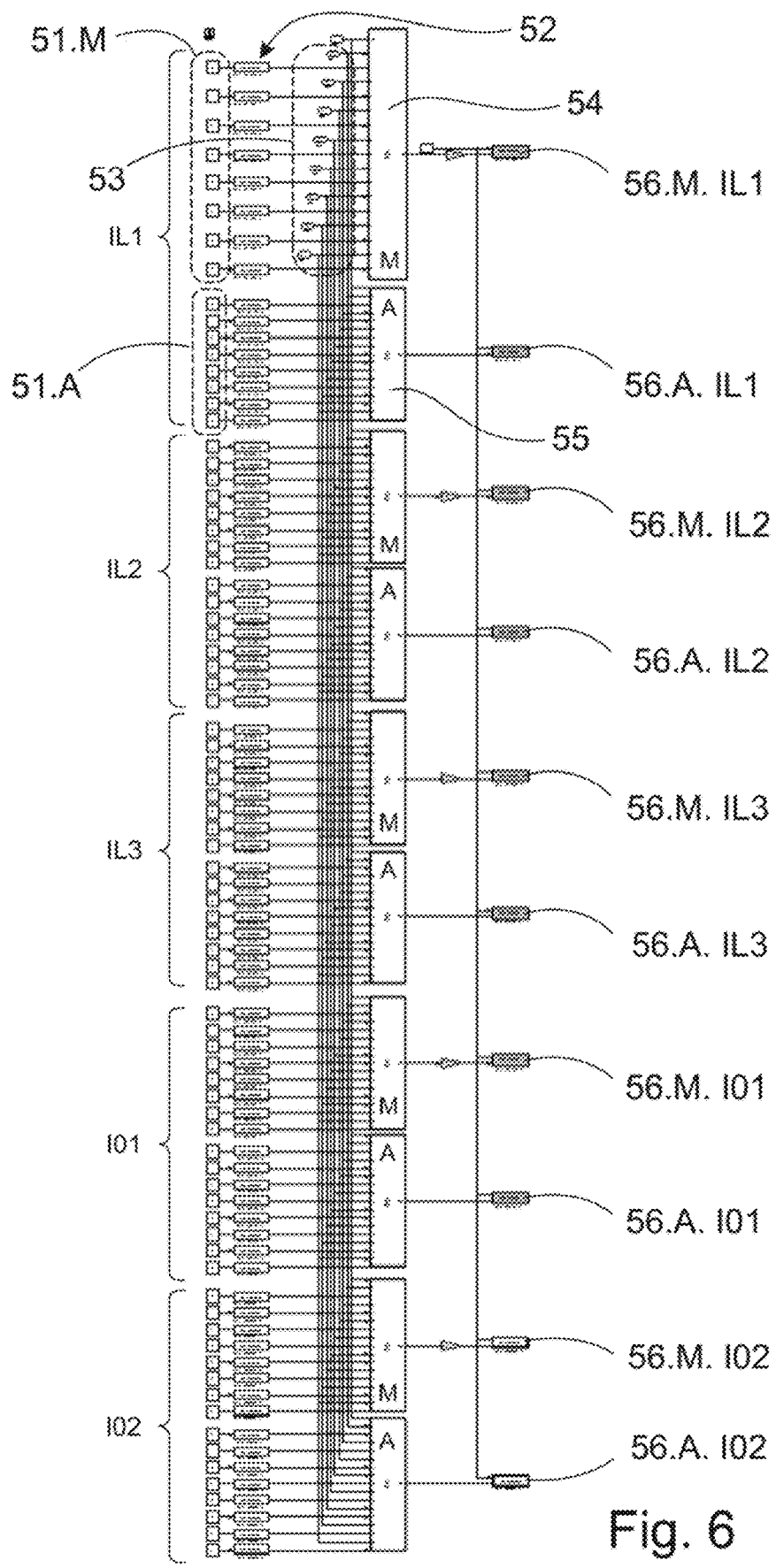
FIGS. 6, 7, and 8 show the programmatic updating arrangement of five correction tables of a current-measurement channel.
Figure 7:
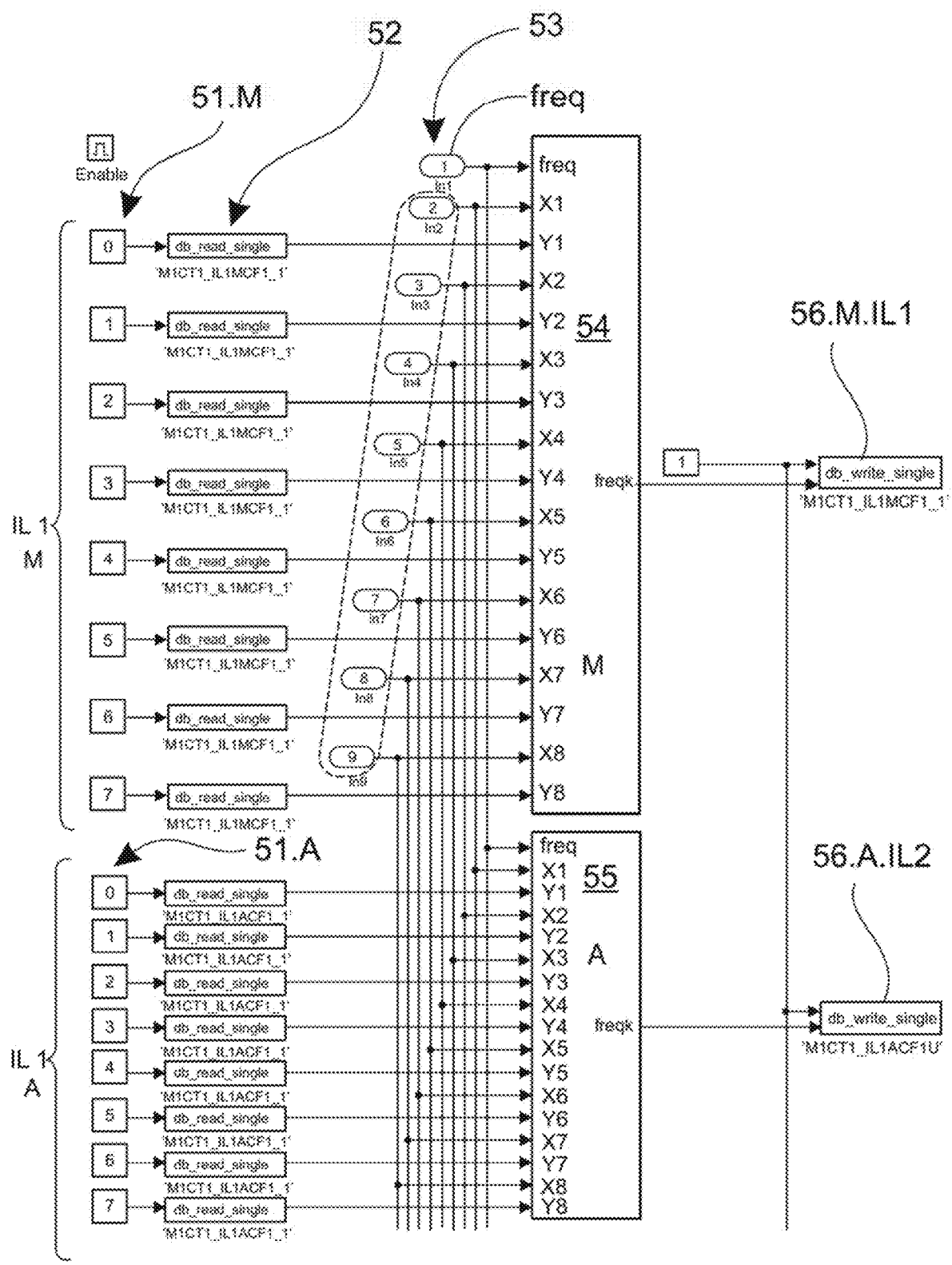
Figure 8:
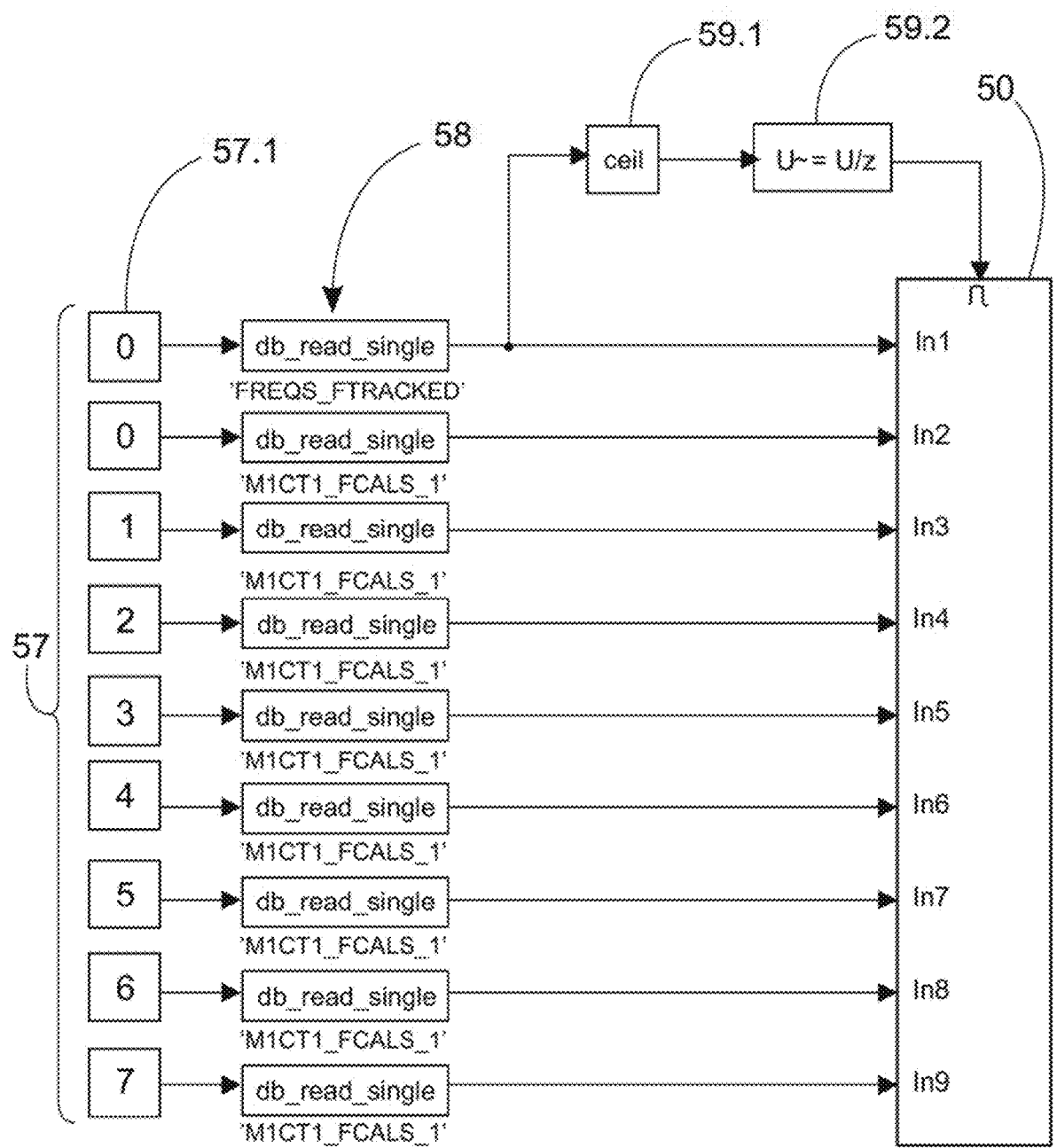

FIGS. 6, 7, and 8 show the software updating of the correction factors of the current measurements IL1, IL2, IL3, I01, and I02 according to the frequency at the time. Corresponding calculation is made in the case of voltage measurement. The system's host processor includes a CPU, RAM/ROM memories, and I/O means, as well as an operating system for running the computation software.

Each current input has separate magnitude and phase-angle correction tables. The momentary calibration values for each channel are stored in registries 52. Controlled by the clock pulse, the outputs 51.M (magnitude) and 51.A (phase angle) read the momentary discrete correction values Y1-Y8 to the approximation calculation modules 54 and 55 (magnitude and phase angles separately, on all channels). The same clock pulse controls the reading of the discrete frequency values (6, 15, 25, 30, 40, 50, 60, and 75 Hz), with which the calibration is made, for all the calculation modules 54, 55 together to the outputs X1-X8 of the various calculation modules. The calibrated factors Y1-Y8 are retrieved from their own, channel-specific column in Table 1. This is calculated on all the current-measurement channels IL1-IL3, IL01, and IL02. The factors are calculated by the linear approximation from these momentary correction values using the following procedure:

X=[X1, X2, X3, X4, X5, X6, X7, X8]; the frequency-dependence factor is an 8-place vector (discrete frequencies 6-75 Hz);

Y=[Y1, Y2, Y3, Y4, Y5, Y6, Y7, Y8]; the magnitude or phase-angle correction factor is an 8-place vector, in which there are factors corresponding to the discrete frequencies;

The discrete frequency X(i) immediately below the measured frequency 'freq' and the corresponding factor Y(i) are sought. The correction value is freqk=(Y(i)+((freq−X(i))*((Y(i+1)−Y(i))/(X(i+1)−X(i))))).

The extreme values Y1 and Y8 of the factors are used above and below the discrete frequencies. The calculated factor is taken to the magnitude/phase-angle registry of the corresponding channel, e.g., the magnitude correction factor of the channel IL1 to the registry 'M1CT1_IL1MCF1_1' (56.M.IL1).

The analog front-end design has a considerable effect on the number of the calibration frequencies required and their selection. If the design is not linear, the desired accuracy can be achieved by increasing the number of calibration points. Similarly, a linear approximation between the discrete points is not necessarily required, if there is a sufficiently large number of discrete points.

In the following is an example of a correction table, in which there are the magnitude and angle correction values of different current-measurement channels IL1, IL2, IL3, I01, and I02 at the discrete frequencies 6-75 Hz (8 items).

TABLE 1

| freq [Hz] | IL1Cf | IL2Cf | IL3Cf | I01Cf | I02Cf |
|---|---|---|---|---|---|
| 6 | 1.00870 | 1.00855 | 1.00673 | 0.90746 | 0.86719 |
| 15 | 1.00758 | 1.00756 | 1.00554 | 0.94732 | 0.90845 |
| 25 | 1.00758 | 1.00776 | 1.00565 | 0.98543 | 0.97558 |
| 30 | 1.00763 | 1.00774 | 1.00569 | 0.98928 | 0.98439 |
| 40 | 1.00842 | 1.00855 | 1.00617 | 0.98968 | 0.98666 |
| 50 | 1.00832 | 1.00836 | 1.00634 | 0.99051 | 0.98772 |
| 60 | 1.00815 | 1.00836 | 1.00573 | 0.99094 | 0.98884 |
| 75 | 1.00773 | 1.00802 | 1.00579 | 0.99111 | 0.98925 |

| freq [Hz] | IL2ang | IL3ang | I01ang | I02ang |
|---|---|---|---|---|
| 6 | −0.03 | 0.00 | −4.63 | −4.23 |
| 15 | −0.02 | 0.00 | −2.53 | −2.70 |
| 25 | −0.01 | 0.00 | −0.88 | −1.28 |
| 30 | −116.94 | −0.02 | −0.42 | −0.69 |
| 40 | 20.52 | 0.01 | −0.28 | −0.47 |
| 50 | 0.00 | 0.00 | −0.18 | −0.32 |

TABLE 1-continued

| | | | | |
|---|---|---|---|---|
| 60 | −0.01 | 0.00 | −0.12 | −0.25 |
| 75 | −0.01 | 0.00 | −0.11 | −0.19 |

The angle value of channel IL1 acts as a reference for the angle values of the other channels.

These values are stored in the card's memory 21, from where they are read to the processor's RAM memory in connection with the initialization relating to starting the device.

Table 1 shows the application's calibrated frequency-dependent function k(f), with the aid of which each measurement channel the said error is eliminated.

In the calculation model of FIGS. 6-8, the momentary values according to each frequency are picked from this table to the calculation registries, by which the measurement values are then calibrated. The calculation registries are updated according to selected criterion.

According to FIG. 8, the approximately measured frequency in Herz is rounded by the unit 59.1 (cell-function) to an integer. The coarse fundamental frequency $f_m$ is calculated in a chosen channel e.g. based on a time difference between two sequential zero points. The condition module 59.2 triggers a new calculation, if the measured frequency has changed by at least 1 Hz from the previous 5-ms round of calculation. The block 50 contains the functions of FIGS. 6 and 7. The memory-location readings 57 shown in FIG. 8 depict the predefined calibration frequency points.

In general, the core of the system is a computer program, which comprises program code for implementing the method described.

The apparent output is calculated using the, as such, known equation:

$$\overline{S_{L1Fund}} = \overline{U_{L1Fund}} \times \overline{conj(I_{L1Fund})}, \text{ in which}$$

$$\overline{U_{L1h(1)}} = \text{Re}_{U_{L1h(1)}} + j\text{Im}_{U_{L1h(1)}} \text{ and}$$

$$\overline{I_{L1h(1)}} = \text{Re}_{I_{L1h(1)}} + \overline{\text{Im}_{I_{L1h(1)}}}$$

From this the effective output and reactive output are calculated using the equations:

$$\overline{S_{3PH}} = (\overline{S_{L1Fund}} + \overline{S_{L2Fund}} + \overline{S_{L3Fund}})$$

$$\overline{P_{3PH}} = \text{real}(\overline{S_{3PH}})$$

$$\overline{Q_{3PH}} = \text{imag}(\overline{S_{3PH}})$$

Accurate calculation requires also taking the harmonic frequency components into account, in which case the apparent output of each phase is calculated as the sum of the frequency components, as follows:

$$\overline{S_{L1}} = (\overline{U_{L1Fund}} \times \overline{conj(I_{L1Fund})}) + (\overline{U_{L1h(1)}} \times \overline{conj(I_{L1h1})}) + \ldots + (\overline{U_{L1hn}} \times \overline{conj(I_{L1hn})})$$

After this, the aforementioned effective-output and reactive-output equations can be applied.

Figure 9A:
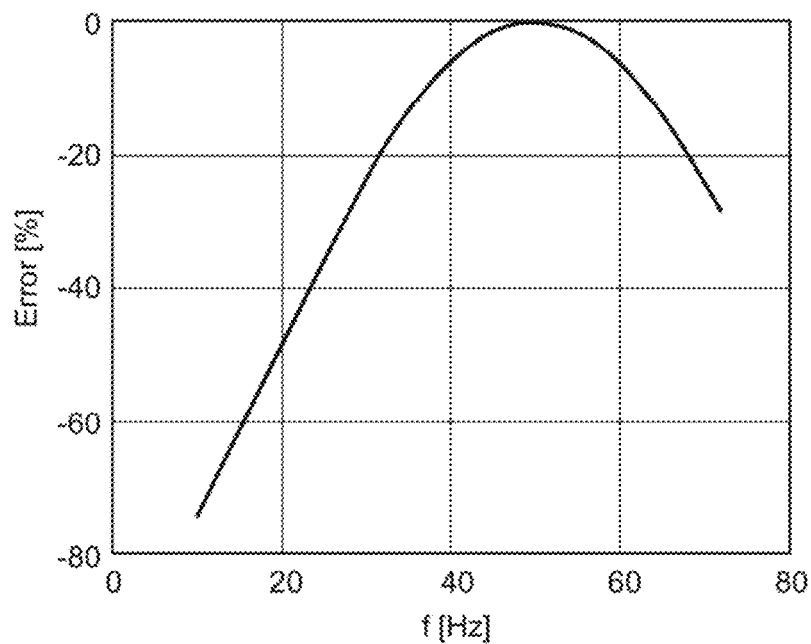
FIG. 9a shows the error of a known measurement as a function of frequency.
Figure 9B:
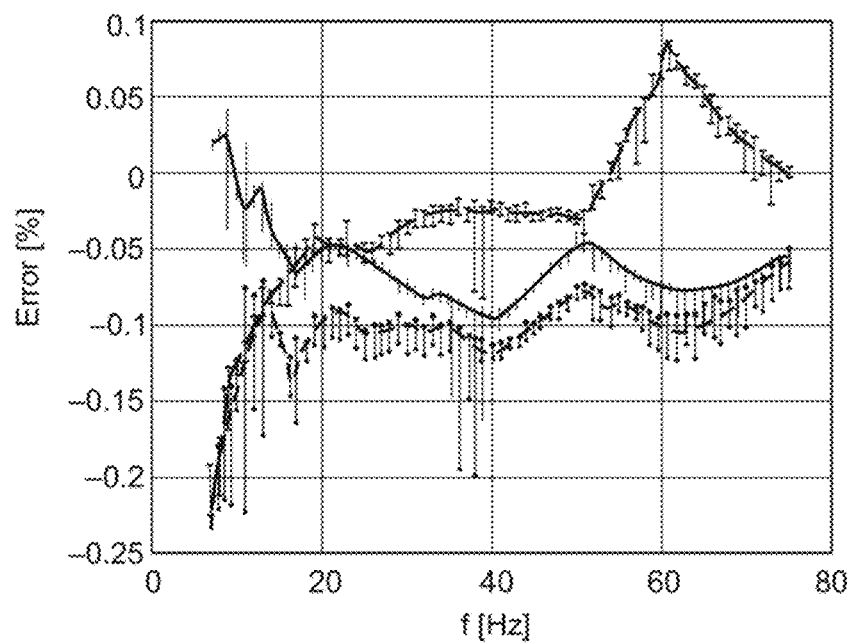
FIG. 9b shows the error of frequency measurement according to the invention using 3-phase currents.

According to FIGS. 9a and 9b, the calculation system according to the invention provides significant frequency stability. According to FIG. 9a, the conventional measurement technique for phase quantities is accurate only at the nominal frequency, in this case 50 Hz. The error in the range 6-75 Hz can be as much as tens of percent. Generally, the error is greater the farther one goes from the nominal frequency and the larger the multiple frequency that is being examined.

The errors of the measurement card according to the invention, for example, at different phase currents, are, according to FIG. 9b, less than 0.25% over the entire frequency range (6-75 Hz).

Figure 10:
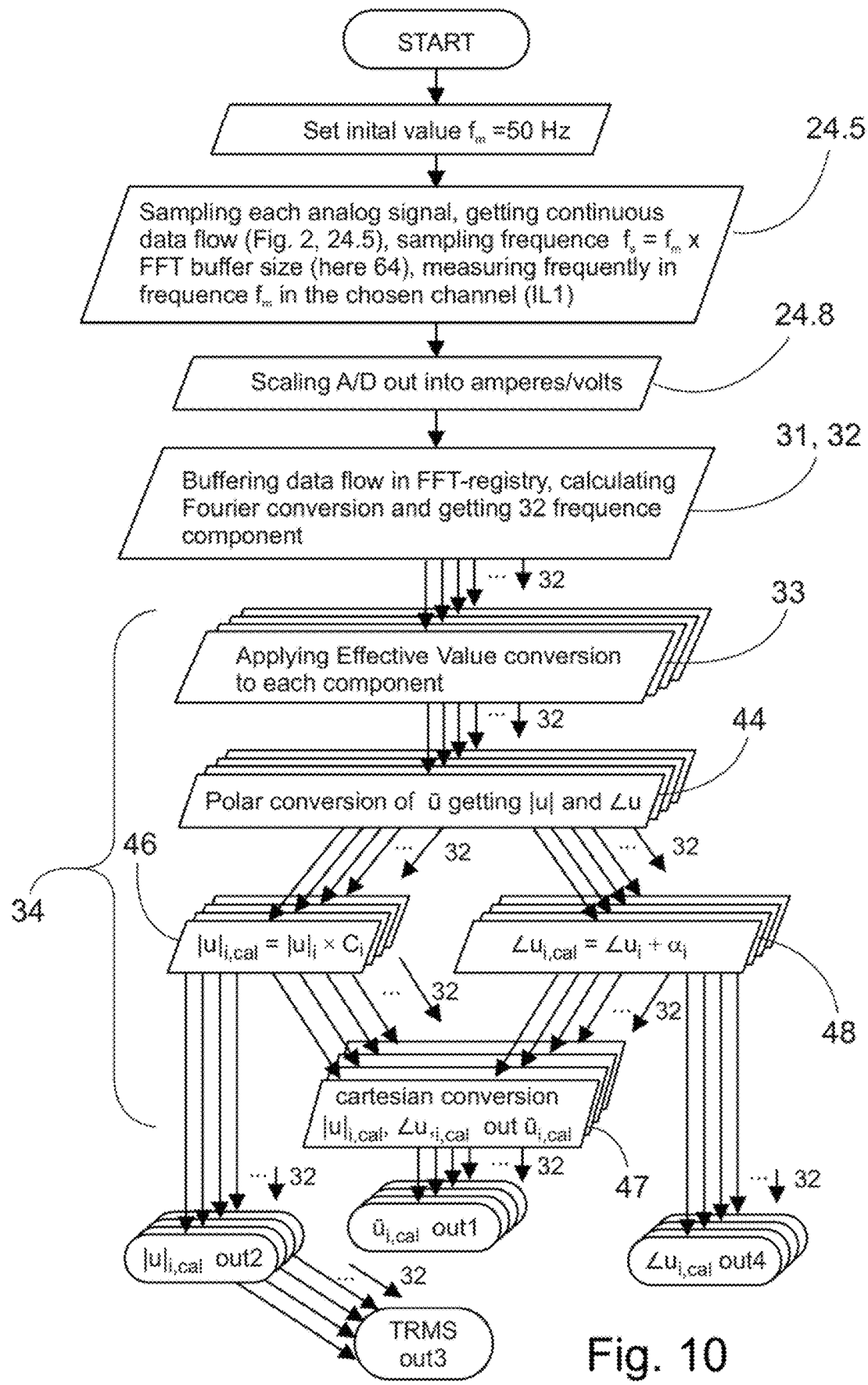
FIG. 10 shows a flow diagram of an example of the frequency correction of voltage measurement.

FIG. 10 shows the measurement procedure of FIGS. 2, 3, 4, and 5 as a flow diagram (here the voltage u is being measured). The momentary correction values are marked with the quantities '$C_i$' (46) and '$\alpha_i$' (48). In the software implementation, the challenge is the large number of real-time calculations, because each separate sampled measurement vector is divided, in this case, into 32 separate vectors, on which a polar conversion is performed, so that there are 64 values to be corrected in each period. The processor operates in 5-ms periods, so that there are 115 200 correction calculations (46, 48) per second in nine channels. The computing power of the prototype system is 300 Megaflops, which is more than enough for the calculation. When the frequency changes, the correction registry must be recalculated (FIGS. 6, 7, and 8, as well as the flow diagrams of FIGS. 11 and 12), so that Fourier or similar transformation must be carried out on the data flow of each channel, and the number of calculation operations required continues to increase. Thus, a frequency tolerance of 1 Hz (generally 0.4-2.5 Hz) has been observed to be optimal in terms of accuracy and computational capacity.

Figure 11:
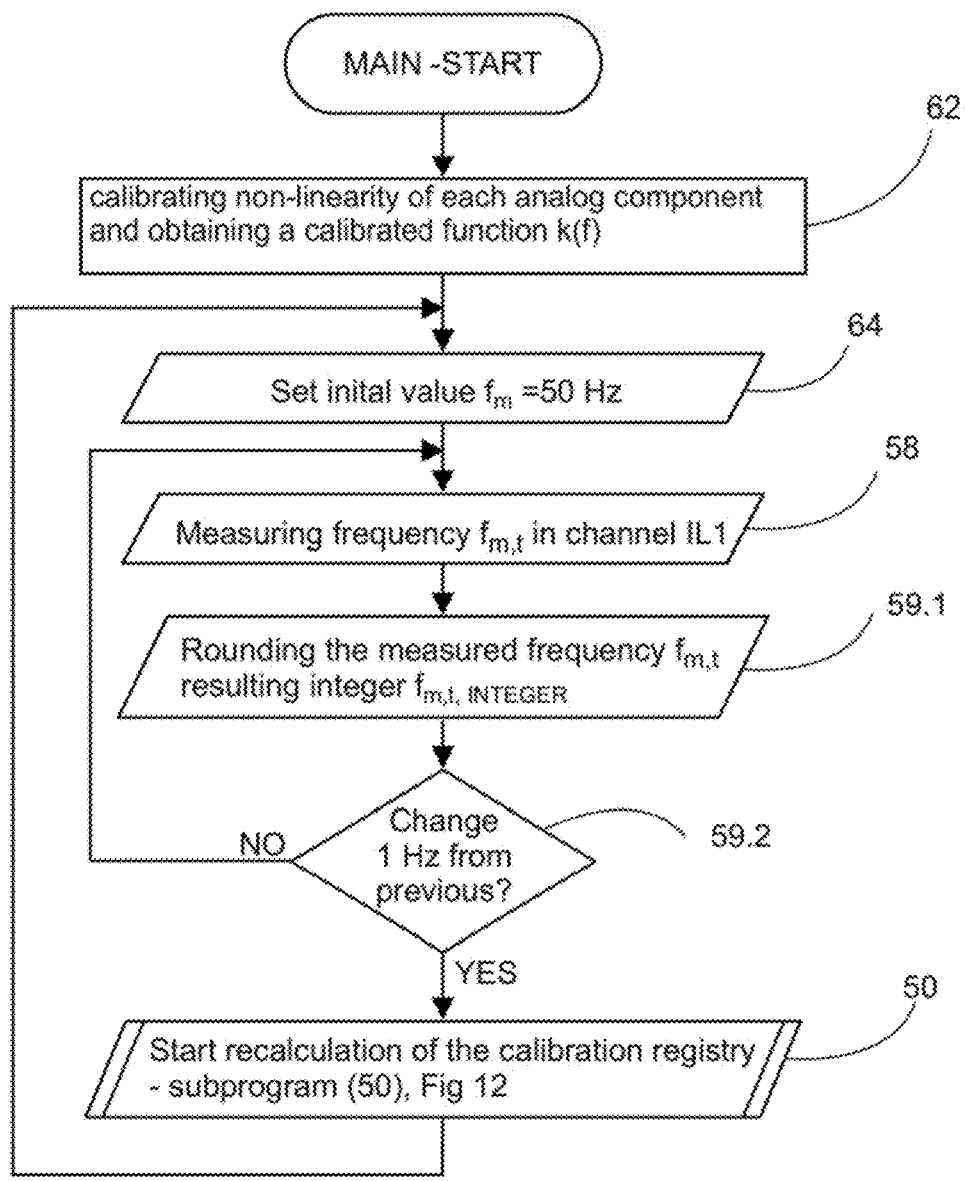
FIG. 11 shows a flow diagram of a main program initiating the re-calculation of a correction table.

In order to start use of the system for measuring 3-phase alternating-current system quantities a calibrated function k(f) should be provided (FIG. 11, step 62). The calibrated function k(f) depicts an amount of correction of each analog channel. Thus, the calibrated function k(f) and the software using it are essential parts of the system itself. FIG. 11 presents the main steps of the method. The parameters depicting the calibrated function k(f) will be preferably stored to a non-volatile memory 21.1 of the special replaceable circuit card 21 (FIG. 2).

Figure 12:
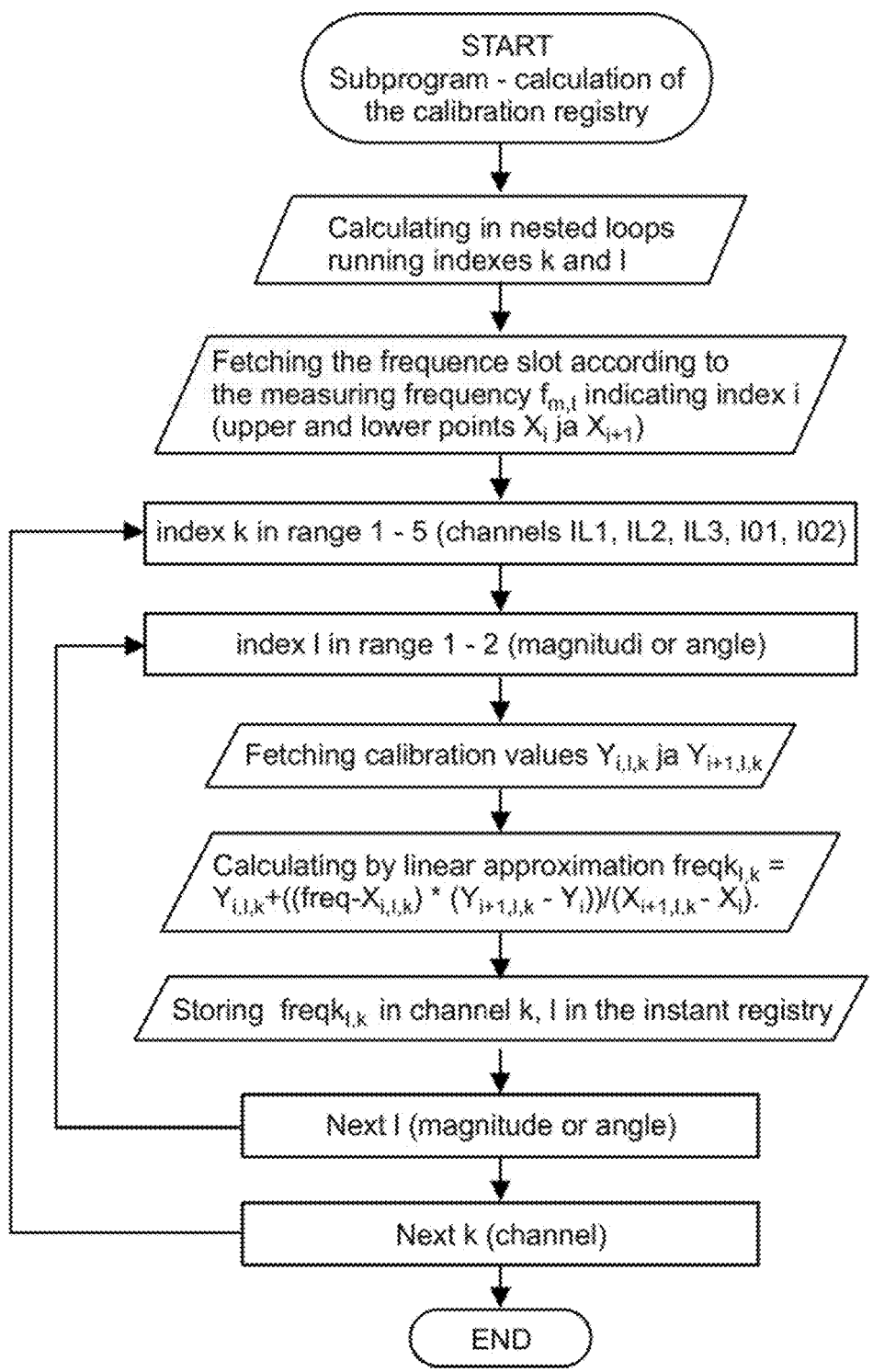
FIG. 12 shows a flow diagram of the re-calculation.

The recalculation of the calibration registry is shown as a flow diagram in FIGS. 11 and 12, corresponding to the different kind of graphical presentation in FIGS. 6-8. In the beginning, the software sets an initial value for frequency $f_m$ (e.g. 50 Hz), at step 64. The momentary frequency is read (58) and the value is rounded to an integer (59.1), after which it is compared with the previous value (59.2), in which there is the condition 'Is there a change of at least 1 Hz from the previous?', and performance of the program continues, either as a loop directly through a preset delay to measurement of the frequency (in the case of NO), or to the recalculation procedure (50), FIG. 12 (in the case of YES).

Figure 13:
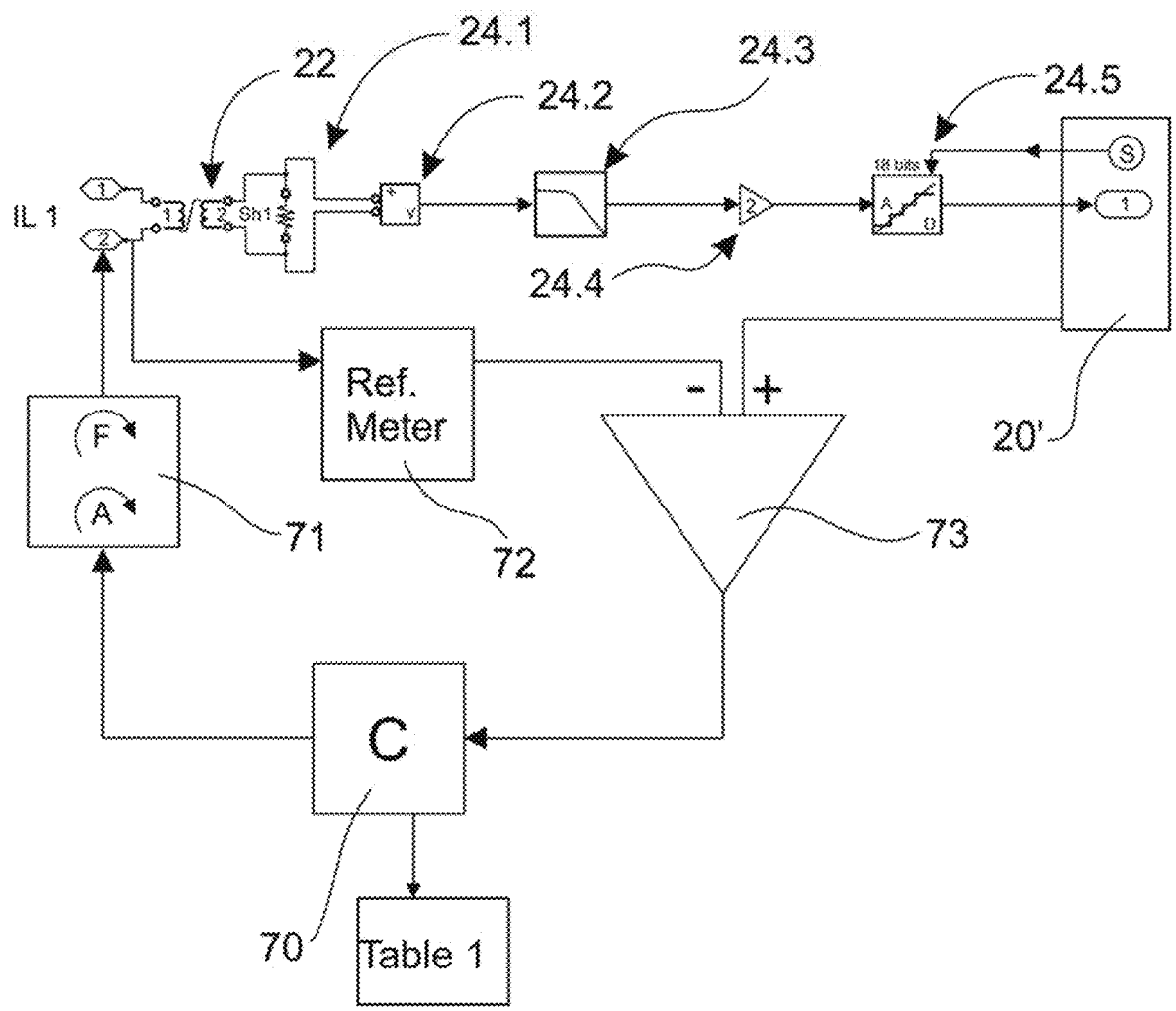
FIG. 13 shows an arrangement for measuring non-linearity of the analog component.

From the flow diagram of the recalculation procedure (FIG. 12), it can be seen that three indices (i, k, l) and two nested loops are required in the calculation. If the measured frequency is, for example, 41.5 Hz, it lies between 40 Hz ($X_4$) and 50 Hz ($X_5$), when the index I=4 and the element ($Y_{4, 1, k}$ and $Y_{5, 1, k}$) is taken from each calibration table 4. and 5. to the linear approximation. FIG. 13 presents a practical example, of how the non-linearity of an analog component of each measurement channel is calibrated at different frequencies and a frequency-dependent correction function k(f) is created. The arrangement comprises the computer part 20' of the apparatus 20 itself for measuring each analog input line (22, 24.1, 24.2, 24.3, 24.5). Each channel has preferably its own A/D-converter 24.5, which is unique with respect to its non-linearity.

The calibration system uses a programmable signal generator 71, which produces signals at pre-set frequencies, here 6, 15, 25, 30, 40, 50, 60, and 75 Hz. Also, the amplitude level is adjusted by the computer 70, but the non-linearity of amplitude variation is less significant. Thus, signals with pre-set frequencies and amplitudes are fed to the input of the channel (I/O-component 22). Simultaneously, the signal is measured accurately by a laboratory reference meter 72.

A comparator module 73 compares the calculated result of the apparatus 20 itself and a value measured by a reference meter 72. Both digital values are brought to a computer 70 having that comparator module 73 (via e.g. RS-485). The comparator module 73 feeds the difference to the computer 70, which stores the value in Table 1. For example, in the channel IL1Cf at 6 Hz the difference has given a ratio of 1.00870 at the set amplitude. Thus, the correct current value is 1.00870 times the measured value.

The Table 1 can be set to a chosen amplitude value, but it can also be formed as an average value of the values measured at different amplitudes.

The values in each column form a calibrated function k(f) of that column, e.g. IL1Cf. At intermediate frequencies, the correction value is interpolated.

The method according to the invention gives an extremely accurate result over a wide frequency range. The frequency-dependent correction is preferably made to the magnitude and phase-angle values of several frequency components. The correction function is preferably a matrix, in the elements corresponding to a specific input are the correction values for discrete frequencies. These can be used in a stepped manner, but it is preferable to interpolate the intermediate values. Extreme values can be used outside the nominal frequency range.

The invention claimed is:

1. Method for measuring 3-phase alternating-current system quantities in an electric-power network through measurement channels in the electric-power network producing frequency-dependent non-linearity errors of analog components using a system having a host processor including a CPU, RAM/ROM memories, and an I/O component and an operating system for running computation software, each said measurement channel in the electric-power network including its own A/D converter and processing an analog signal depicting a selected current or voltage quantity and producing digital output using the A/D converter, the method comprising the steps of:
 a) providing a frequency-dependent correction function called a calibrated function k(f) depicting non-linearity of each said measurement channel in the electric-power network at different frequencies including a base frequency and at least one harmonic frequency,
 b) producing an analog signal through each channel, depicting said selected current or voltage quantity,
 c) measuring frequency $f_m$ of the analog signal approximately in a chosen channel,
 d) producing momentary frequency-dependent correction values to eliminate said non-linearity errors using said calibrated function k(f) at the approximately measured frequency and storing them in a registry,
 e) sampling at least one analog signal at a frequency $f_s$ that is a multiple of the approximately measured frequency $f_m$ at a multiple frequency $f_s$, creating a base series depicting a period on the corresponding measurement channel,
 f) from each base series obtained, calculating a base frequency and at least one of magnitude and phase-angle values of at least one harmonic frequency component with the aid of a selected frequency analysis,
 g) correcting each calculated magnitude or phase-angle value or both using the momentary frequency-dependent correction values in the registry in order to eliminate error of each measurement channel, and
 h) calculating selected quantities from calibrated magnitude or phase-angle values or both,
 i) wherein the momentary frequency-dependent correction values in the registry are recalculated using the calibrated function k(f) when the measured frequency $f_m$ changes more than a selected criterion, non-linearity of an analog component of each measurement channel is calibrated at different frequencies, and an accurate result is obtained over a wide frequency range,
 j) wherein the correction function includes correction values for the base frequency and at least one harmonic frequency, each of these correction values correcting each amplitude and/or phase-angle in a discrete base frequency or a discrete harmonic frequency, receptively, and wherein intermediate values are interpolated.

2. Method according to claim 1, wherein the calibrated function k(f) is created by calibrating non-linearity of each analog component of each measurement channel at different frequencies.

3. Method according to claim 1, wherein each correction function comprises a table containing discrete correction values at selected calibration frequencies.

4. Method according to claim 1, wherein the magnitude or phase-angle values or both are calculated for 7-64 harmonic frequency components.

5. Method according to claim 1, wherein the magnitude or phase-angle values or both are calculated for 15-31 harmonic frequency components.

6. Method according to claim 1, wherein the said measurement range is 5-100 Hz.

7. Method according to claim 1, wherein the said measurement range is 6-75 Hz.

8. Method according to claim 1, wherein the selected analysis belongs to the group of conventional Fourier, FFT, and Wavelet analysis.

9. Method according to claim 1, comprising the step of calibrating each channel magnitude-dependently.

10. Method according to claim 1, comprising the step of using FFT calculation and setting the sampling frequency $f_s$ continuously relative to the measured frequency $f_m$ using the equation $$f_s = f_m \times \text{number of samples of the FFT buffer.}$$

11. System for measuring 3-phase alternating-current quantities in an electric-Dower network, the system having a host processor including a CPU, RAM/ROM memories, and an I/O component and an operating system for running computation software, the system being connected to the electric-power network and comprising:
 a) an analog component comprising several measurement channels in the electric-power network, each said measurement channel including its own A/D converter for processing an analog signal depicting a selected current or voltage quantity and producing a digital output, each channel having non-linearity at different frequencies including a base frequency and at least one harmonic frequency,
 b) the processor being configured to measure frequency $f_m$ of the analog signal approximately,
 c) the memory including a registry storing momentary frequency-dependent correction values compensating for said non-linearity of each channel, each single correction value corresponding to all magnitudes or all phase angles, respectively,
 d) said A/D converters sampling each analog signal approximately at a frequency $f_s$ that is a multiple of a measured frequency $f_m$ creating a base series depicting a period on each measurement channel, e) the processor being configured to calculate a base frequency and a magnitude or phase-angle value or both of at least one harmonic frequency component from each of the base series obtained, f) the processor being configured to correct each calculated magnitude or phase-angle value or both using the momentary frequency-dependent correction values in the registry in order to eliminate error based on said non-linearity of each measurement channel, g) the processor being configured to calculate the selected quantities from the calibrated magnitude or phase-angle values or both, h) a condition module configured by the processor, the condition module triggering recalculation when the measured frequency $f_m$ changes more than a selected criterion, and i) the processor being configured to calculate the momentary frequency-dependent correction values in the registry, when triggered, wherein non-linearity of an analog component of each measurement channel is calibrated at different frequencies, and an accurate result is obtained over a wide frequency range.

12. System according to claim 11, wherein the system comprises at least one replaceable circuit card comprising one measurement-channel analog component and an A/D converter.

13. System according to claim 12, wherein the said replaceable circuit card comprises the analog components of several channels and a non-volatile memory arranged to store the calibration factors of the measurement card.

14. System according to claim 11, wherein said correction table comprises a matrix, the elements of which correspond to a specific input and are the correction values for discrete frequencies.

15. System according to claim 11, wherein the system comprises a CPU, RAM/ROM memories, and I/O means, as well as an operating system for running the calculation software.

16. Computer program comprising program code for implementing the method according to claim 1.

* * * * *